United States Patent [19]
Bazes

[11] Patent Number: 6,140,857
[45] Date of Patent: Oct. 31, 2000

[54] METHOD AND APPARATUS FOR REDUCING BASELINE WANDER

[75] Inventor: Mel Bazes, Haifa, Israel

[73] Assignee: Intel Corporation, Santa Clara, Calif.

[21] Appl. No.: 09/280,245

[22] Filed: Mar. 29, 1999

[51] Int. Cl.[7] .................................................. H03L 5/00
[52] U.S. Cl. ............................ 327/307; 327/538; 327/74
[58] Field of Search .............................. 327/307, 53, 66, 327/538, 543, 74, 77, 78, 79, 89; 323/315, 317; 330/288

[56] References Cited

U.S. PATENT DOCUMENTS

| | | | |
|---|---|---|---|
| 5,341,034 | 8/1994 | Matthews | 324/539 |
| 5,488,306 | 1/1996 | Bonaccio | 327/534 |
| 5,880,615 | 3/1999 | Bazes | 327/307 |
| 6,044,489 | 3/2000 | Hee et al. | 714/815 |
| 6,047,031 | 4/2000 | Allott et al. | 375/317 |

OTHER PUBLICATIONS

"Two Novel Fully Complementary Self–Biased CMOS Differential Amplifiers," IEEE J. of Solid State Circuits, vol. 26, No. 2, pp. 165–168 (Feb. 1991).

"DC–Sensing Circuits Added," *Electronic Engineering Times*, p. 76, May 8, 1995.

T. Vafiades, "Baseline Wander and 100Base–TX," Mar. 1995.

Novel Transceiver Feedback Circuit Cures 100–Mbit Technology's "Baseline Wander" Woes, *Electronic Design*, p. 39, Jun. 12, 1995.

*Primary Examiner*—Tuan T. Lam
*Attorney, Agent, or Firm*—Blakely, Sokoloff, Taylor & Zafman LLP

[57] ABSTRACT

A method and an apparatus for reducing baseline wander in a differential signal. In one embodiment, the differential signal is carried in first and second signal lines. If negative baseline wander is detected in the differential signal, a first pair of current sources is activated. One of the first pair of current sources thereby sources current into the first signal line and the other one of the first pair of current sources thereby sinks current from the second signal line as a result until the negative baseline wander is reduced to a level approximately equal to a preset threshold value. If positive baseline wander is detected in the differential signal, a second pair of current sources is activated. One of the second pair of current sources thereby sinks current from the first signal line and the other one of the second pair of current sources thereby sources current to the second signal line as a result until the positive baseline wander is reduced to a level approximately equal to a preset threshold value.

20 Claims, 9 Drawing Sheets

METHOD AND APPARATUS FOR REDUCING BASELINE WANDER

BACKGROUND OF THE INVENTION

1. Field of the Invention

The present invention relates generally to data transmission technology and, more specifically, the present invention relates to the sensing of differential signals.

2. Background Information

Differential data communications signals rarely have 50% duty cycles. Therefore, their frequency spectrum generally includes a DC component. If differential data communications signal duty cycle varies continuously, as is usually the case, then the DC component also varies. If such a signal is sent through a medium, which blocks the DC component, an undesirable phenomenon known as baseline wander occurs. If baseline wander is not cancelled out or compensated for, the phenomenon can cause increased bit-error rate (BER), which results in a serious degradation in performance.

Figure 1A:
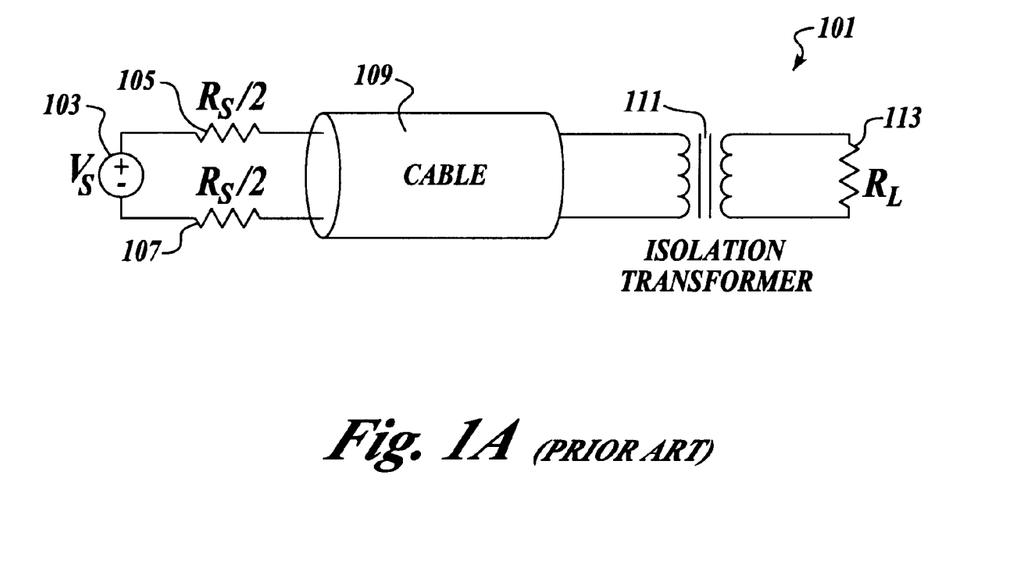
FIG. 1A is an illustration showing a typical data communication medium utilizing an isolation transformer.
Figure 1B:
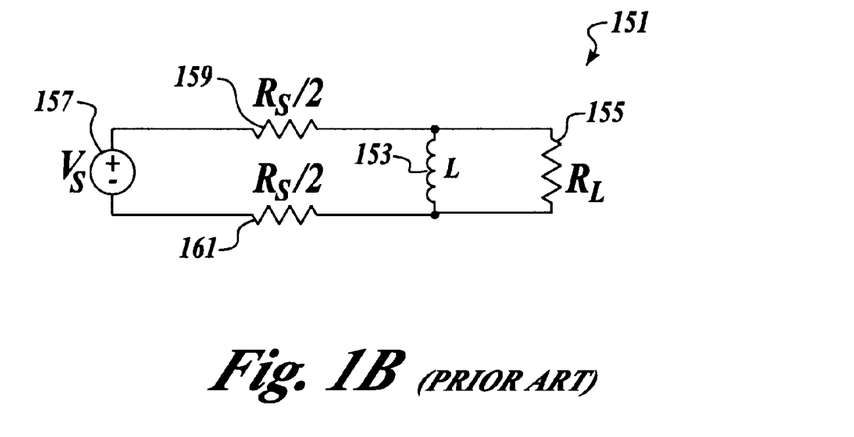
FIG. 1B is an illustration of a simplified equivalent circuit of a data communications medium utilizing an isolation transformer.

FIG. 1A illustrates a typical data communication medium 101 through which a DC signal component cannot pass. This medium includes a transmitter, modeled as a voltage source 103, a source impedance, modeled as source resistors 105 and 107 having a resistance of $R_S/2$, a cable 109, an isolation transformer 111, and the receiver, modeled as load resistor $R_L$ 113. FIG. 1B illustrates the simplified equivalent circuit of the medium 151. The inductor L 153, which models the transformer inductance, shorts out any DC component and only allows AC components to pass through to $R_L$ 155. As a result, no DC signal component from the transmitter, which includes voltage source 157 and source resistors 159 and 161, can pass through medium 151.

Figure 2:
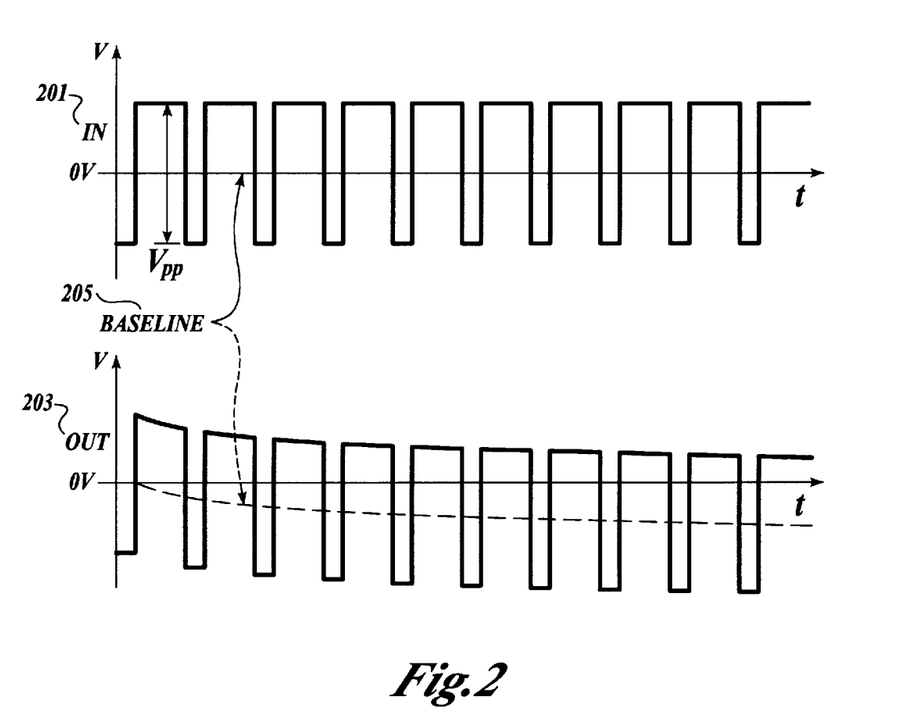
FIG. 2 is a plot illustrating baseline wander for the case of a differential signal.

FIG. 2 illustrates baseline wander for the case of a differential signal, i.e., a signal not referenced to ground, that is transmitted through the circuits 101 and 151 of FIGS. 1A and 1B, respectively. As shown in FIG. 2, the baseline 205 of the input signal IN 201 is constant at 0 volts. In contrast, the baseline 205 of the output signal OUT 203 decreases asymptotically from 0 volts to a negative value.

In general, the baseline asymptote of a differential signal having a constant duty cycle D is given by Equation 1 below.

$$V_{BASE} = \frac{V_{P-P}}{2}(1 - 2D) \quad \text{(Equation 1)}$$

$V_{BASE}$ is the baseline voltage and $V_{P-P}$ is the peak-to-peak differential amplitude of the signal.

In the example in FIG. 2, D equals 0.75. Thus, the baseline asymptote equals $-V_{P-P}/4$ in accordance with Equation 1 above. It is noted, however, that the duty cycle generally varies continuously so that the baseline 205 varies or wanders continuously.

A device that receives a differential signal such as OUT 203 converts the differential signal to a logic signal for subsequent processing using a comparator whose threshold is set midway between the two levels of the received signal. With the threshold set in this fashion, the receiver noise margin is maximized. If the baseline wanders, however, then the difference between the peak voltage of the received signal and the comparator threshold is no longer constant, but, rather, also varies along with the baseline. As the peak voltage varies, the comparator switches at different times with respect to the locations of transitions in the received signal. This introduces jitter that reduces timing margins in the clock and data recovery circuit that follows the comparator. The reduction in timing margin causes an increase in the bit-error rate.

SUMMARY OF THE INVENTION

A baseline wander reduction method and apparatus is disclosed. In one embodiment, the method includes the steps of detecting a negative baseline wander in a differential signal carried in first and second lines and sourcing current into the first signal line and sinking current from the second signal line if negative baseline wander is detected. The method also includes the steps of detecting a positive baseline wander in the differential signal and sinking current from the first signal line and sourcing current into the second signal line if positive baseline wander is detected. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

Methods and apparatuses for reducing baseline wander in a signal are disclosed. The subject of the invention will be described with reference to numerous details set forth below, and the accompanying drawings will illustrate the invention. The following description and the drawings are illustrative of the invention and are not to be construed as limiting the invention. Numerous specific details are described to provide a thorough understanding of the present invention. However, in certain instances, well known or conventional details are not described in order not to obscure the present invention in detail.

The present invention provides in one embodiment a method and apparatus for reducing a substantial portion of the baseline wander in a differential signal at the receiver input so that threshold error caused by the baseline wander is substantially reduced. Whatever threshold error is left may be compensated for by using known baseline wander compensation techniques, such as for example but not limited to a technique disclosed in currently pending U.S. patent application entitled "Method and Apparatus for Detecting Threshold Differential Levels While Compensating for Baseline Wander," Ser. No. 08/764,720, filed Dec. 10, 1996, and assigned to the Assignee of the present invention. In one embodiment, baseline wander is reduced by sourcing current into a first signal line and sinking current from a second signal line in the event that negative baseline wander is detected in the signal. Similarly, baseline wander is also reduced by sinking current from the first signal line and sourcing current into the second signal line in the event that positive baseline wander is detected in the signal. In one embodiment, the present invention is integrated into an equalizer circuit at the input of a receiver. Since the present invention reduces baseline wander from the signal at the very input of the receiver, the signal does not drive the receiver circuitry into the non-linear region of operation and cause degraded operation. The residual baseline wander at the input of the receiver in one embodiment is too small to drive the receiver circuitry into non-linear operation.

Figure 3:
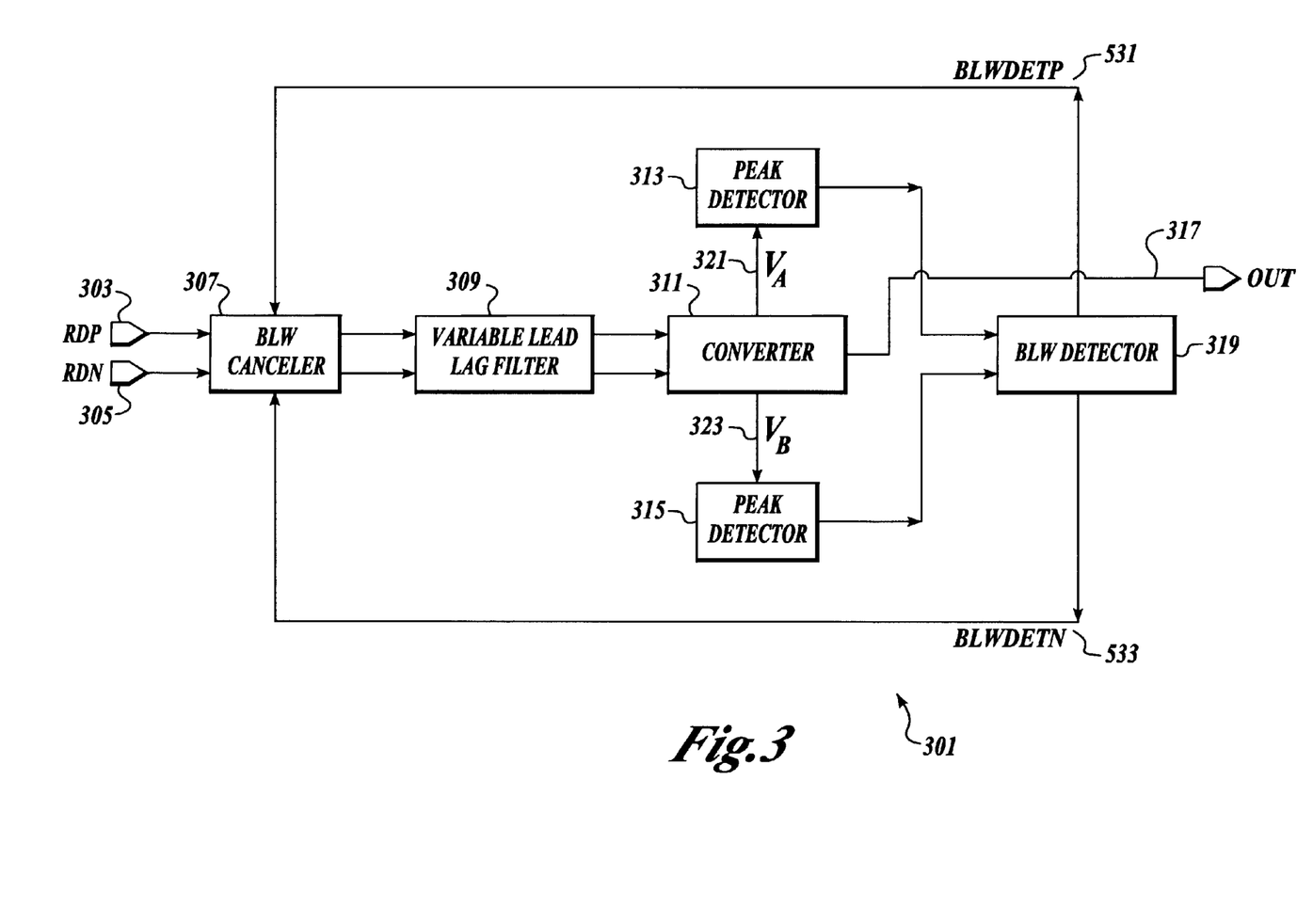
FIG. 3 is a block diagram of an equalizer incorporating a baseline wander reduction apparatus in accordance with the teachings of one embodiment of the present invention.

FIG. 3 is a block diagram illustrating one embodiment of an equalizer that incorporates a baseline wander reduction apparatus in accordance with the teachings of the present invention. As shown in FIG. 3, a differential signal is received by baseline wander canceler 307 from a first signal line RDP 303 and a second signal line RDN 305. In one embodiment, the differential signal is propagated through variable lead-lag filter 309 and converter 311 such that output OUT 317 is generated. In one embodiment, converter 311 also generates using known techniques complementary single-ended signals $V_A$ 321 and $V_B$ 323, which are received by peak detector 313 and peak detector 315, respectively. The outputs of peak detectors 313 and 315 are received by baseline wander detector 319. Baseline wander detector 319 detects negative or positive baseline wander in the differential signal received on RDP 303 and RDN 305. The negative or positive baseline wander detected by baseline wander detector 319 is fed back to and received by baseline wander canceler 307 as BLWDETP 531 and BLWDETN 533 to reduce the baseline wander in the differential signal carried in RDP 303 and RDN 305.

Figure 4:
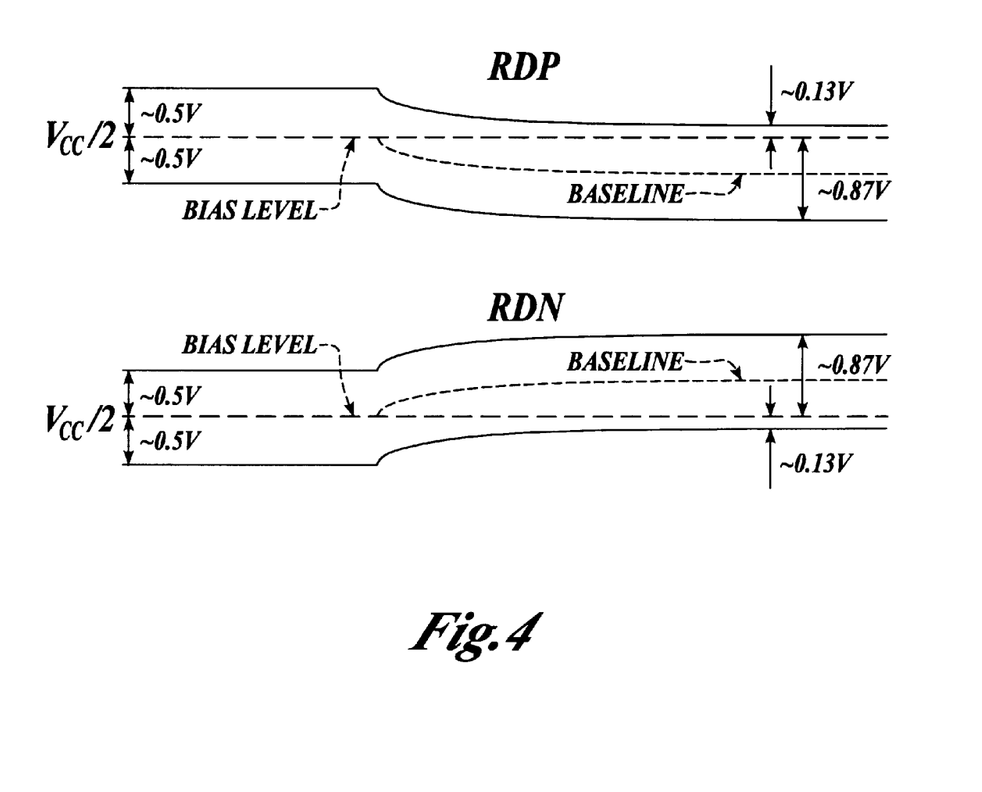
FIG. 4 is a plot illustrating baseline wander occurring in two input signals of the present invention.

To illustrate the operation of baseline wander reduction, FIG. 4 illustrates schematically the envelope of a 100Base-TX Ethernet signal that undergoes worst-case baseline wander, such as that caused by a so-called "killer packet" (a data packet that is specially designed to maximize baseline wander). RDP and RDN are the two receiver inputs.

The signals to RDP and RDN are ideally, but not necessarily, biased at $V_{CC}/2$ with respect to ground, where $V_{CC}$ is the supply voltage. The differential signal swings about this bias level. The signal swings in 100Base-TX Ethernet is a maximum of 1.0 volt peak-to-peak at each input, referred to ground, which translates into a maximum differential voltage of 2.0 volts peak-to-peak between the two inputs.

The signal swings about the bias level, which in the embodiment illustrated is $V_{CC}/2$. When the average duty cycle is 50 percent, the baseline is located exactly at the bias level. However, when the duty cycle strays from 50 percent, the baseline moves away from the bias level, as illustrated in FIG. 4. When the baseline is not located at the bias level, the signal becomes asymmetric. That is, excursions above the bias level and below the bias level are not equal in amplitude. For purposes of this disclosure, the baseline wander illustrated in FIG. 4, in which the RDP signal wanders in the negative direction and the RDN signal wanders in the positive direction, is denoted negative baseline wander. Baseline wander in which the RDP signal wanders in the positive direction and the RDN signal wanders in the negative direction is denoted negative baseline wander.

Figure 5:
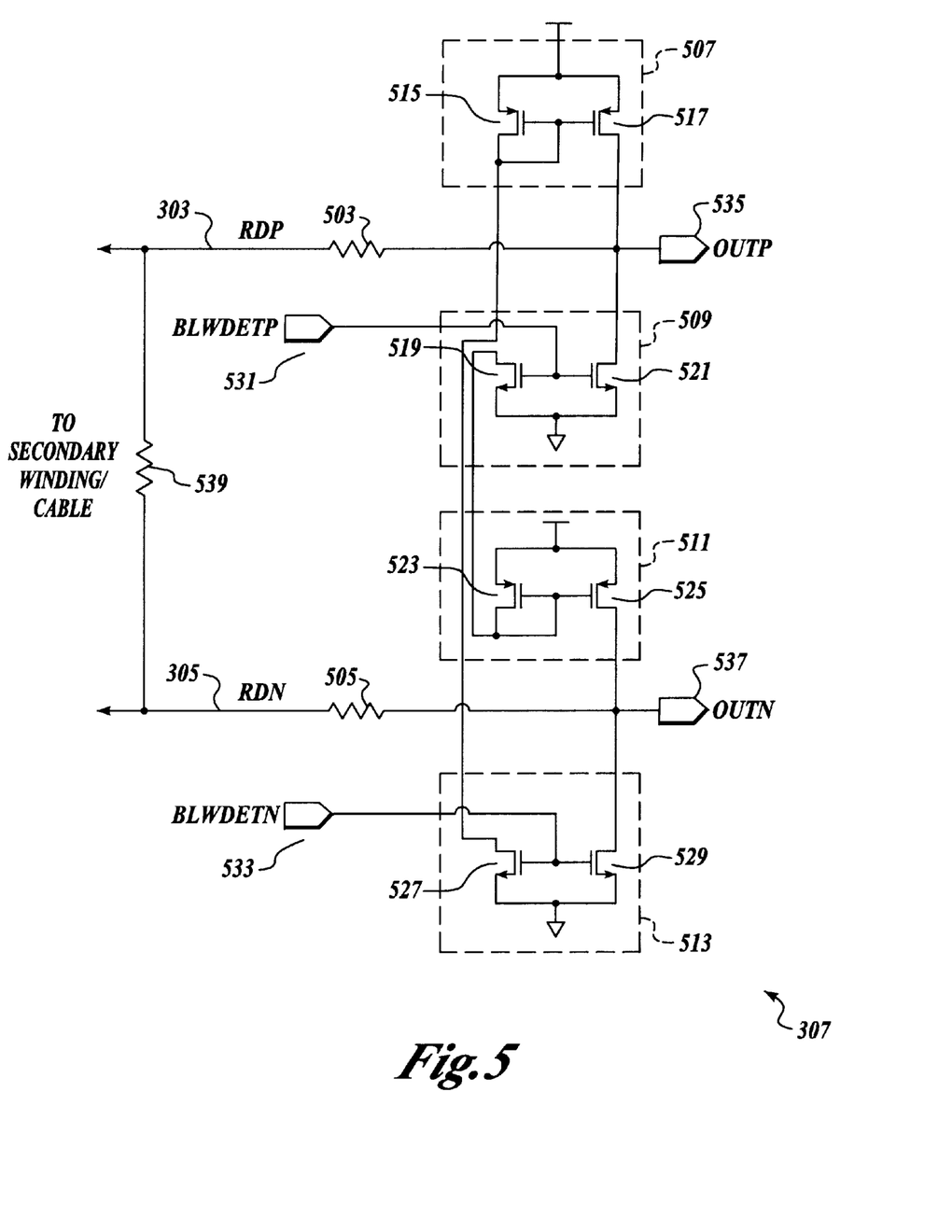
FIG. 5 is a schematic of one embodiment of a baseline wander canceler in accordance with the teachings of the present invention.

FIG. 5 is a schematic of one embodiment of baseline wander canceler circuit 307 in accordance with the teachings of the present invention. As shown in FIG. 5, the signal on RDP 303 passes through a series resistor 503 and is output at OUTP 535. The signal on RDN 305 passes through a series resistor 505 and is output at OUTN 537. In one embodiment, a pull-up current source 507 is coupled between OUTP 535 and $V_{CC}$ and a pull-down current source 509 is coupled between OUTP 535 and ground. A pull-up current source 511 is coupled between OUTN 537 and $V_{CC}$ and a pull-down current source 513 is coupled between OUTN 537 and ground.

In one embodiment, current source 507 includes matched p-channel transistors 515 and 517 having commonly coupled gates, and current source 509 includes matched n-channel transistors 519 and 521 having commonly coupled gates. In one embodiment, current source 511 includes matched p-channel transistors 523 and 525 having commonly coupled gates, and current source 513 includes matched n-channel transistors 527 and 529 having commonly coupled gates. As shown in FIG. 5, the gate and drain of p-channel transistor 515 are coupled to the drain of n-channel transistor 527 and the gate and drain of p-channel transistor 523 are coupled to the drain of n-channel transistor 519 in one embodiment.

As will be discussed in greater detail below, the BLWDETP 531 signal becomes active in the event that positive baseline wander is detected in the differential signal carried on RDP 303 and RDN 305. Conversely, the BLWDETN 533 signal becomes active in the event that negative baseline wander is detected in the differential signal carried on RDP 303 and RDN 305. As shown in FIG. 5, BLWDETP 531 is coupled to the gates of n-channel transistors 519 and 521 and BLWDETN 533 is coupled to the gates of n-channel transistors 527 and 529.

As a result, when positive baseline wander has been detected in the differential signal carried on RDP 303 and RDN 305, current source 509 is activated to sink current from OUTP 535 and current source 511 is activated to source current to OUTN 537 to reduce baseline wander. Since n-channel transistors 519 and 521 in current source 509 are exactly matched to each other, they form a current mirror through which substantially equal currents flow. The current flowing into the drain of n-channel transistor 519 forces an equal current to flow out of the drain of p-channel transistor 523. Since p-channel transistors 523 and 525 in current source 511 are exactly matched to each other, they too form a current mirror through which substantially equal currents flow. Thus, through current-mirroring, the current sunk by n-channel transistor 521 in current source 509 is substantially equal to the current sourced by p-channel transistor 525 in current source 511. As long as baseline wander is present the signal carried on BLWDETP 531 remains active. When baseline wander disappears the signal carried on BLWDETP 531 is deactivated thereby deactivating current sources 509 and 511.

Similarly, when negative baseline wander has been detected in the differential signal carried on RDP 303 and RDN 305, current source 513 is activated to sink current from OUTN 537, and current source 507 is activated to source current to OUTP 535 to reduce baseline wander. Since n-channel transistors 527 and 529 in current source 513 are exactly matched to each other, they form a current mirror through which substantially equal currents flow. The current flowing into the drain of n-channel transistor 527 forces an equal current to flow out of the drain of p-channel transistor 515. Since p-channel transistors 515 and 517 in current source 507 are exactly matched to each other, they too form a current mirror through which substantially equal currents flow. Thus, through current-mirroring, the current sunk by n-channel transistor 529 in current source 513 is substantially equal to the current sourced by p-channel transistor 517 in current source 507. As long as baseline wander is present the signal carried on BLWDETN 533 remains active. When baseline wander disappears the signal carried on BLWDETP 533 is deactivated thereby deactivating current sources 513 and 507.

In one embodiment, BLWDETP 531 and BLWDETN 533 are never active at the same time. Therefore, each pair of current sources is never active at the same time. In one embodiment, current source 507 is matched with current source 513. Similarly, current source 509 is matched with current source 511. Thus, when one current source sources current into one of the signal lines, the other current source, through current-mirroring, sinks the same amount of current from the other one of the signal lines. The current follows a loop from the sourcing current source into the sinking current source.

As shown in FIG. 5, the loop goes through series resistors 503 and 505 and the combination of a transformer secondary winding (not shown) coupled in parallel with a termination resistor 539. In one embodiment, series resistors 503 and 505 are approximately 1000 ohms and termination resistor 539 is approximately 100 ohms. Under the control of BLWDETP 531 and BLWDETN 533, the voltage drop around the loop created by current sources 507, 509, 511 and 529 forces the baseline of the differential signal carried on RDP 303 and RDN 305 to return nearly to the bias level. In this way, the difference between the location of the baseline and the bias level—the baseline wander—is nearly canceled.

Figure 6:
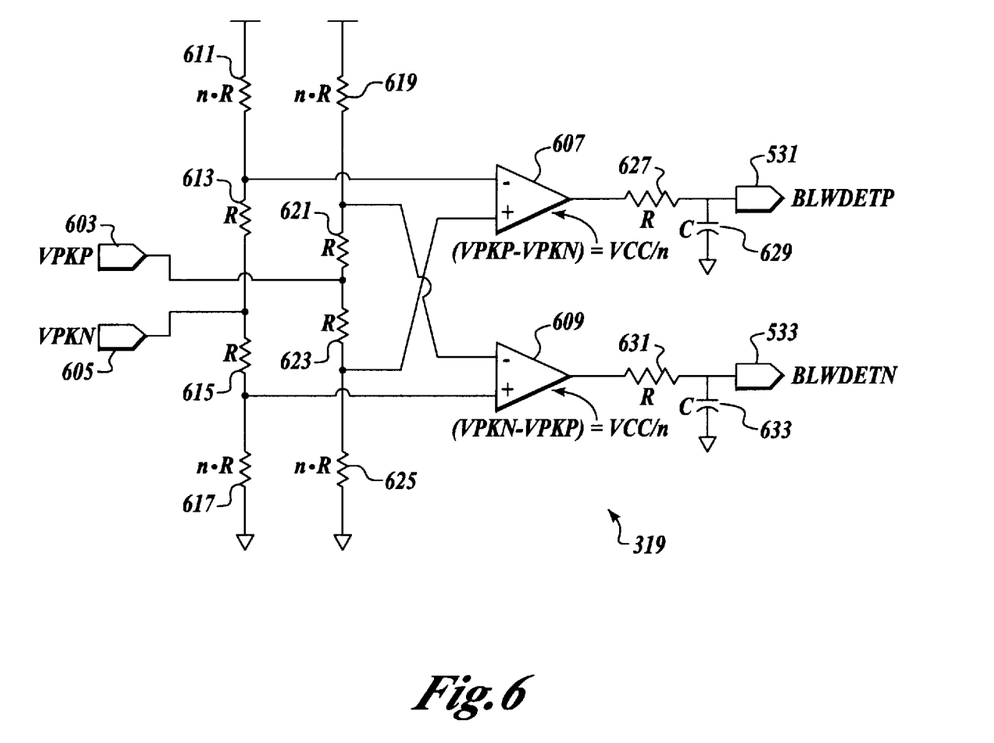
FIG. 6 is a schematic of one embodiment of a baseline wander detector in accordance with the teachings of the present invention.

FIG. 6 is a schematic of one embodiment of a baseline wander detector 319 in accordance with the teachings of the present invention. As shown in FIG. 6, baseline wander detector 319 generates BLWDETP 531 and BLWDETN 533 in response to a peak signal VPKP 603, which is generated by peak detector 313 using known techniques, and in response to a peak signal VPKN 605, which is generated by peak detector 315 using known techniques. In one embodiment, baseline wander detector 319 includes series coupled resistors 611, 613, 615 and 617 coupled between $V_{CC}$ and ground. Series coupled resistors 619, 621, 623 and 625 are also coupled between $V_{CC}$ and ground. A first comparator 607 has a negative input coupled to a node between resistors 611 and 613. Comparator 607 has a positive input coupled to a node between resistor 623 and 625. A second comparator 609 has a negative input coupled to a node between resistors 619 and 621. Comparator 609 has a positive input coupled to a node between resistors 615 and 617. In one embodiment, an output of comparator 607 is BLWDETP 531, which is filtered through a low-pass RC filter including resistor 627 and capacitor 629. In one embodiment, an output of comparator 609 is BLWDETN 533, which is filtered through a low-pass RC filter including resistor 631 and capacitor 633.

VPKP 603 equals the positive peak amplitude of RDP 303, which may be attenuated by the circuitry preceding peak detector 313. VPKN 605 equals the positive peak amplitude of RDN 305, which may be attenuated by the circuitry preceding peak detector 315. During operation, when there is no baseline wander, VPKP 603 and VPKN 605 are substantially equal to each other. In one embodiment, it is noted that in the absence of baseline wander, the difference between VPKP 603 and VPKN 605 does not equal zero but, rather, equals some small value that varies with time. This difference stems from the variation in the input peak voltage over time, which causes VPKP 603 and VPKN 605 to vary somewhat as the peak detector samples the inputs.

When baseline wander occurs, the difference between VPKP 603 and VPKN 605, which is otherwise small, increases substantially. When the baseline wander detector 319 senses that the difference between VPKP 603 and VPKN 605 exceeds some preset threshold value, it activates one of the two enable signals, BLWDETP 531 or BLWDETN 533, depending on whether there is positive baseline wander or negative baseline wander. In one embodiment, BLWDETP 531 goes high for positive baseline wander, while BLWDETN 533 goes high for negative baseline wander. In one embodiment, the preset threshold voltage is required for preventing the baseline wander detector 319 from outputting in an enable signal, either BLWDETP 531 or BLWDETN 533, during regular (i.e. non-baseline wander) operation as a result of the small variations that normally exist between VPKP 603 and VPKN 605.

Referring to FIG. 3, the baseline wander canceler 307 and the baseline wander detector 319 are connected within a negative-feedback loop, as follows. When either BLWDETP 531 or BLWDETN 533 starts going high, the baselines of the signals at inputs RDP 303 and RDN 305 begin returning towards the bias level, and the voltage difference between the peak detector outputs, VPKP 603 and VPKN 605, begins decreasing. BLWDETP 531 (or BLWDETN 533) continues increasing in voltage until the voltage difference between VPKP 603 and VPKN 605 just equals the preset threshold voltage. At this point, through negative feedback, BLWDETP 531 (or BLWDETN 533) levels off at its steady-state voltage level. The RC low-pass filters serve a dual function: they both filter the large variations that are present in steady-state operation and they create a dominant pole that guarantees that the feedback loop connecting baseline wander canceler 307 and baseline wander detector 319 remains stable and does not oscillate.

As discussed earlier, BLWDETP 531 and BLWDETN 533 are filtered in one embodiment with simple RC low-pass filters in order to remove the large variations that are present during steady-state operation during baseline wander. During steady-state operation, baseline wander is canceled out to the point that the difference between VPKP 603 and VPKN 605 approximately equals the preset threshold voltage. At that point, small variations in VPKP 603 and VPKN 605 cause large swings at the output of the appropriate comparator inside the baseline wander detector 319 as the comparator threshold is repeatedly crossed. The low-pass filters filter out these large variations but pass the slow variations caused by baseline wander.

In one embodiment, the threshold voltage for BLWDETP 531 is given by:

$$VPKP - VPKN = VCC/n, \quad \text{(Equation 2)}$$

while the threshold voltage for BLWDETN 533 is $$VPKN - VPKP = VCC/n. \quad \text{(Equation 3)}$$

In one embodiment, resistors 613, 615, 621 and 623 have a resistance of R and resistors 611, 617, 619 and 625 have a resistance of n×R. With respect to Equations 2 and 3, n is the integer that determines the size of resistors 611, 617, 619 and 625 relative to resistors 613, 615, 621 and 623. In one embodiment, resistors 611, 617, 619 and 625 are actually comprised of n resistors having a resistance of R coupled in series so that their total resistance is n×R. Thus, Equations 2 and 3 for the threshold voltages BLWDETP 531 and BLWDETN 533 are independent of the actual value of R, and only depend on the integer n and on $V_{CC}$. Since they are independent of the value R, they have increased immunity to processing and temperature variations.

Figure 7:
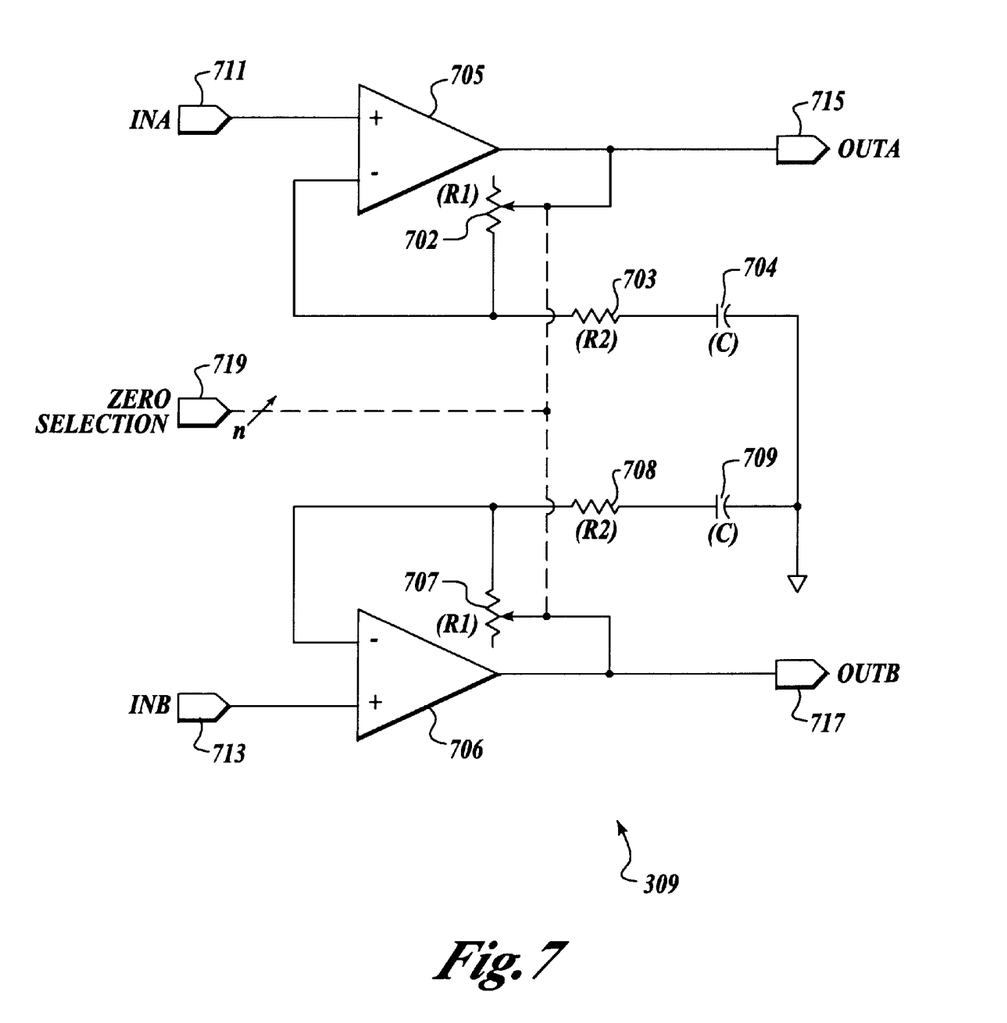
FIG. 7 is a schematic of one embodiment of a lead-lag filter in accordance with the teachings of the present invention.

FIG. 7 is a schematic of one embodiment of one portion of a variable lead-lag filter 309 in accordance with the teachings of the present invention. In one embodiment, lead-lag filter 309 is one of two filter circuits coupled in series. Each filter circuit is similar, and therefore only the characteristics of one of the filter circuits is described in detail here. A detailed description of variable lead-lag filter 309 is provided in currently pending U.S. patent application entitled "Adaptive Equalization using a Minimum-Jitter Criterion," Ser. No. 09/008,050, filed Jan. 16, 1998 and assigned to Assignee of the present invention.

As shown in FIG. 7, lead-lag filter 309 includes a first operational amplifier 705 having a positive input coupled to receive a positive portion of a differential input signal (e.g. an MLT-3 signal), from INA 711. Operational amplifier 705 also includes a negative input coupled to resistors 702 and 703 having resistances R1 and R2, respectively, and coupled to a capacitor 704 having a capacitance C, as shown, in order to implement a known first-order filtering arrangement.

In one embodiment, lead-lag filter 309 also includes a second operational amplifier 706, configured to mirror the first operational amplifier 705. In one embodiment, a negative portion of the differential input signal is provided to the positive input of second operational amplifier 706 from INB 713. The negative input of the second operational amplifier 706 is coupled to resistors 707 and 708, also having resistances of R1 and R2, respectively, and coupled to a capacitor 709 also having a capacitance C. In one embodiment, INA 711 and INB 713 are received from baseline wander canceler 307. In one embodiment, operational amplifier 705 generates an output OUTA 715 and operational amplifier 706 generates an output OUTB 717.

In one embodiment, resistors 702 and 707 (with resistance R1) are implemented as variable resistors using a digital zero selection 719 to accomplish an equalizer adjustment function. The operational amplifiers can be implemented as a fully-complementary, self-biased, very-wide-common-mode-range differential amplifier, such as described in U.S. Pat. No. 4,958,133, and in "Two Novel Fully Complementary Self-Biased CMOS Differential Amplifiers," IEEE J. of Solid State Circuits, vol. 26, no. 2, pp. 165–68 (February 1991).

Figure 8:
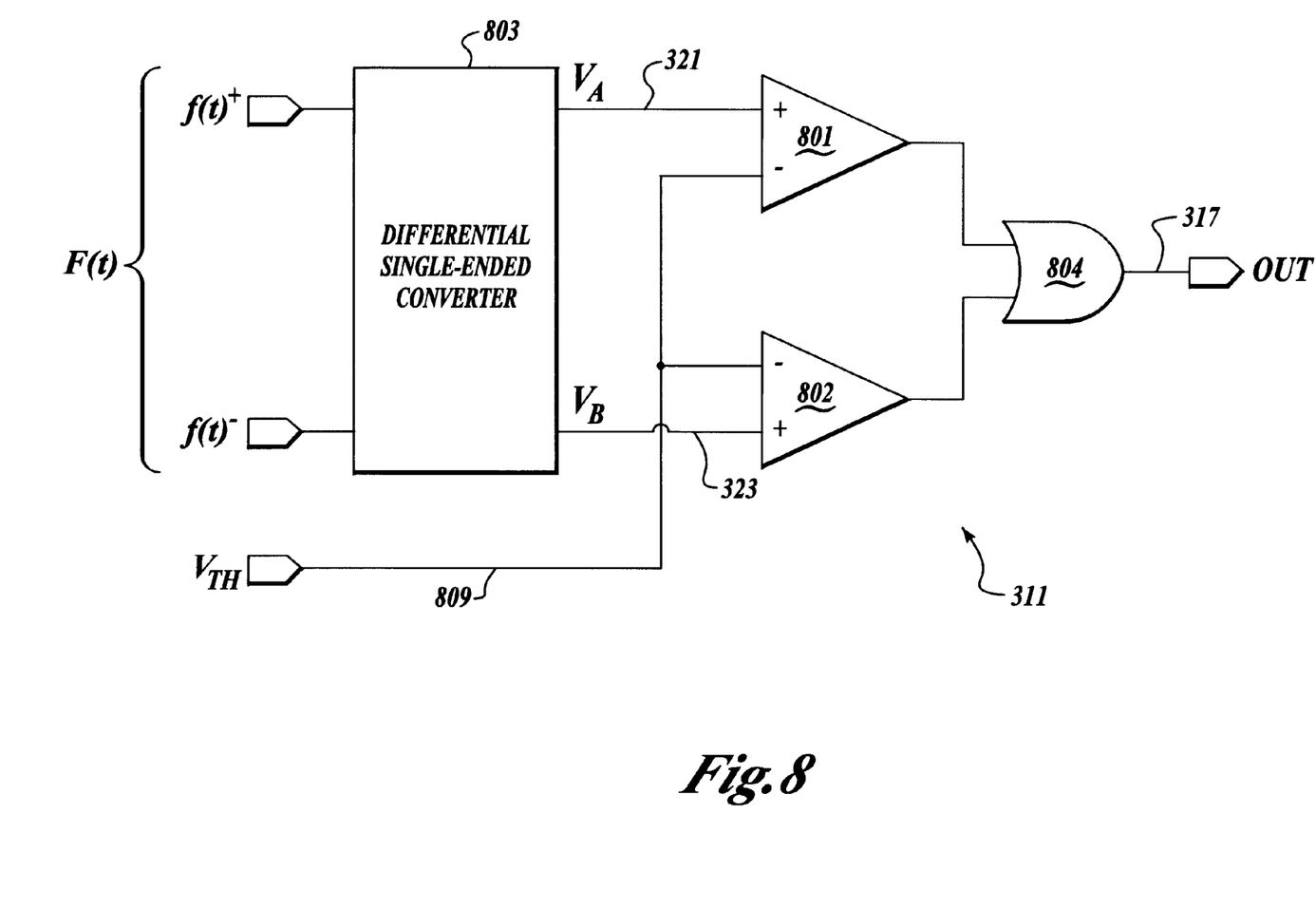
FIG. 8 is a schematic of one embodiment of a converter in accordance with the teachings of the present invention.

FIG. 8 is a schematic of one embodiment of a converter 311 in accordance with the teachings of the present invention. A detailed description of converter 311 is provided in currently pending U.S. patent application entitled "Adaptive Equalization using a Minimum-Jitter Criterion," Ser. No. 09/008,050, filed Jan. 16, 1998 and assigned to Assignee of the present invention.

Figure 9A:
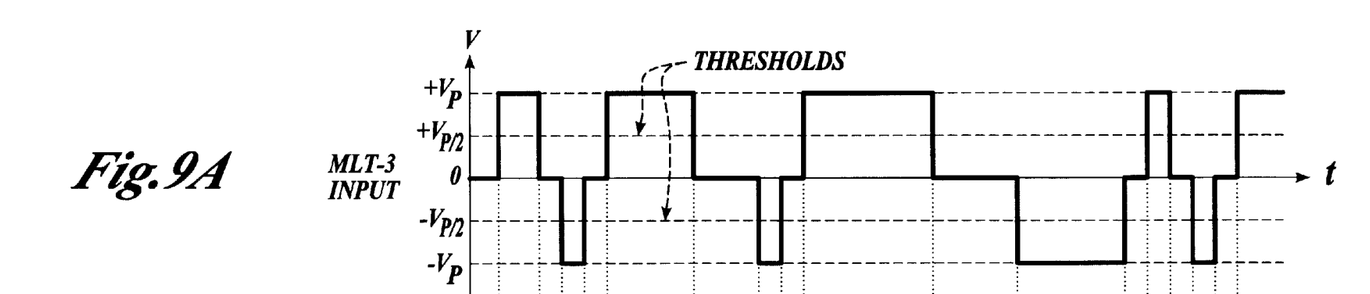
FIGS. 9A–9D are illustrations showing exemplary waveforms in accordance with the teachings of one embodiment of the present invention.

In one embodiment, converter 311 is implemented for use with an MLT-3 signal. It is appreciated that other types of signals may be accommodated in accordance with the teachings of the present invention by standard modifications. The MLT-3 pulse code is a three-level differential pulse code that makes a transition whenever a "1" exists in the unencoded input data. FIG. 9A illustrates an exemplary MLT-3 waveform for a filtered data signal f(t). In one embodiment, filtered data signal f(t) is received from variable lead-lag filter 309.

Referring back to FIG. 8, one embodiment of converter 311 includes a differential/single-ended converter block 803 and comparators 801 and 802. The differential/single-ended converter block 803, as is known to those skilled in the art, converts the differential signal f(t) into two complementary single-ended signals $V_A$ 321 and $V_B$ 323. In one embodiment, $V_A$ 321 is coupled to be received by peak detector 313 and $V_B$ 323 is coupled to be received by peak detector 315. In the absence of baseline wander, $V_A$ 321 and $V_B$ 323 have the same peak voltages, as shown in FIG. 9A. A detailed description of an example of a differential/single-ended converter implementation is provided in currently pending U.S. patent application entitled "Method and Apparatus for Detecting Threshold Differential Levels While Compensating for Baseline Wander," Ser. No. 08/764,720, filed Dec. 10, 1996, and assigned to the Assignee of the present invention.

Figure 9B:
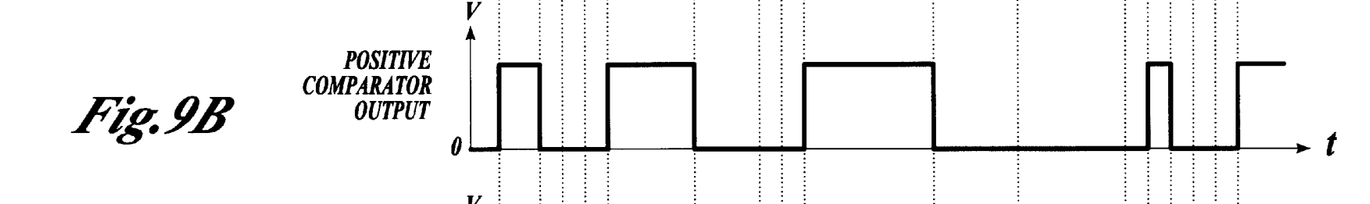
Figure 9C:
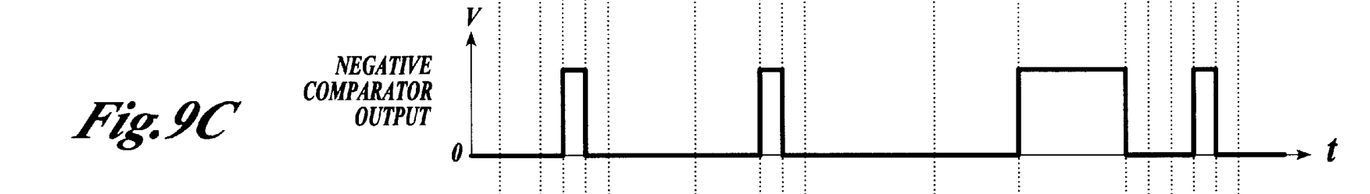
Figure 9D:
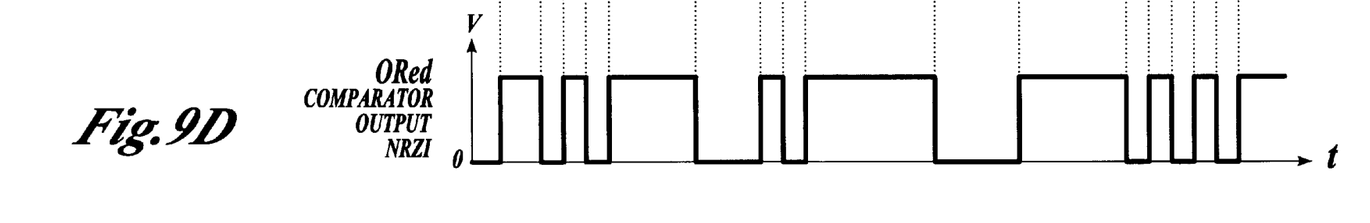

The signals $V_A$ 321 and $V_B$ 323 are applied to positive inputs of comparators 801 and 802. A threshold voltage $V_{TH}$ is provided using known techniques to the negative inputs of comparators 801 and 802. In one embodiment, $V_{TH}$ is set at $V_P/2$, where $V_P$ is a filtered data signal's peak differential voltage. The outputs of comparators 801 and 802 are logically ORed together by logical-OR gate 804 to provide a single-ended output signal at OUT 317. The outputs of comparators 801 and 802 are illustrated in FIGS. 9B and 9C. In one embodiment, an NRZI pulse code is generated at OUT 317 as shown in FIG. 9D. Since both the MLT-3 and NRZI pulse codes make transitions whenever the input signal has a transition, the NRZI code contains exactly the same information as in the MLT-3 pulse code. However, whereas the MLT-3 code cannot be processed with conventional two-level logic, the NRZI code can be processed conveniently with conventional two-level logic such as CMOS.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method for reducing baseline wander in a differential signal carried in first and second lines, the method comprising:

detecting a negative baseline wander in the differential signal;

sourcing current into the first signal line and sinking current from the second signal line when the negative baseline wander is detected;

detecting a positive baseline wander in the differential signal; and     sinking current from the first signal line and sourcing current into the second signal line when the positive baseline wander is detected.

2. The method for reducing baseline wander described in claim 1 wherein the steps of detecting the negative baseline wander includes the steps of:

comparing a first peak amplitude of a signal signal carried in the first line with a second peak amplitude of a signal carried in the second signal line; and generating a negative baseline wander enable signal when a difference between the second and first peak amplitudes is greater than a threshold value.

3. The method for reducing baseline wander described in claim 1 wherein the steps of detecting the positive baseline wander includes the steps of:

comparing a first peak amplitude of a signal carried in the first signal line with a second peak amplitude of a signal carried in the second signal line; and generating a positive baseline wander enable signal when a difference between the first and second peak amplitudes is greater than a threshold value.

4. The method for reducing baseline wander described in claim 2 further comprising filtering the negative baseline wander enable signal.

5. The method for reducing baseline wander described in claim 4 further comprising filtering the positive baseline wander enable signal.

6. The method for reducing baseline wander described in claim 1 further comprising filtering the differential signal with a lead-lag filter.

7. The method for reducing baseline wander described in claim 1 wherein the differential signal is a multilevel differential signal, the method further comprising converting the multilevel differential signal into a single-ended binary signal.

8. A baseline wander reduction apparatus, comprising:

a baseline wander canceler circuit coupled to receive a multilevel differential signal carried in first and second signal lines;

a converter coupled to said baseline wander canceler to generate a single-ended binary signal;

a first peak detector circuit coupled to the converter to generate a first peak amplitude signal;

a second peak detector circuit coupled to the converter to generate a second peak amplitude signal; and a baseline wander detector circuit coupled to receive the first and second peak amplitudes signals to generate a positive baseline wander enable signal and a negative baseline wander enable signal;

the baseline wander canceler circuit to source current into the first signal line and sink current from the second signal line in response to the negative baseline wander enable signal, the baseline wander canceler circuit to sink current from the first signal line and source current into the second signal line in response to the positive baseline wander enable signal.

9. The baseline wander reduction apparatus described in claim 8 wherein the baseline wander canceler circuit comprises:

a first current source coupled between a first potential and the first signal line;

a second current source coupled between the first signal line and a second potential;

a third current source coupled between the first potential and the second signal line, the second and third current sources activated in response to the positive baseline wander enable signal; and a fourth current source coupled between the second signal line and the second potential, the first and fourth current sources activated in response to the negative baseline wander enable signal.

10. The baseline wander reduction apparatus described in claim 9 wherein the first current source sources current to the first signal line and the fourth current source sinks current from the second signal line in response to the negative baseline wander enable signal, wherein the second current source sinks current from the first signal line and the third current source sources current to the second signal line in response to the positive baseline wander enable signal.

11. The baseline wander reduction apparatus described in claim 8 wherein the baseline wander detector circuit comprises:

a first resistor network circuit coupled between a first potential and a second potential, the second peak amplitude signal coupled to the first resistor network circuit;

a second resistor network circuit coupled between the first potential and the second potential, the first peak amplitude signal coupled to the second resistor network circuit;

a first comparator having a first input coupled to the first resistor network circuit, the first comparator having a second input coupled to the second resistor network circuit, the first comparator generating the positive baseline wander enable signal; and a second comparator having a first input coupled to the second resistor network circuit, the second comparator having a second input coupled to the first resistor network circuit, the second comparator generating the negative baseline wander enable signal.

12. The baseline wander reduction apparatus described in claim 11 further comprising:

a first low-pass filter coupled to an output of the first comparator; and a second low-pass filter coupled to an output of the second comparator.

13. The baseline wander reduction apparatus described in claim 8 further comprising a lead-lag filter coupled between the baseline wander canceler circuit and the converter.

14. A baseline wander reduction apparatus, comprising:

a first pull up circuit coupled to a first signal line;

a first pull down circuit coupled to the first signal line;

a second pull up circuit coupled to a second signal line;

a second pull down circuit coupled to the second signal line; and a baseline wander detector circuit coupled to the first and second signal lines, the baseline wander detector circuit to generate a positive baseline wander enable signal and a negative baseline wander enable signal, the first pull down circuit and the second pull up circuit activated in response to the positive baseline wander enable signal, the first pull up circuit and the second pull down circuit activated in response to the negative baseline wander enable signal.

15. The baseline wander reduction apparatus described in claim 14 further comprising:

a first peak detector coupled to the first and second signal lines to generate a first peak amplitude signal coupled to be received by the baseline wander detector circuit;

a second peak detector coupled to the first and second signal lines to generate a second peak amplitude signal coupled to be received by the baseline wander detector circuit.

16. The baseline wander reduction apparatus described in claim 15 further comprising a converter coupled to the first and second signal lines to generate complementary first and second single-ended signals, the first and second single-ended signals coupled to be received by the first and second peak detectors, respectively.

17. The baseline wander reduction apparatus described in claim 16 further comprising a lead-lag filter coupled to the first and second signal lines to filter a multilevel differential signal carried in the first and second signal lines, the filtered multilevel differential signal coupled to be received by the converter.

18. The baseline wander reduction apparatus described in claim 14 wherein the first pull up circuit, the first pull down circuit, the second pull up circuit and the second pull down circuit comprise first, second, third and fourth current sources, respectively, the first current source coupled between a first potential and the first signal line, the second current source coupled between the first signal line and a second potential, the third current source coupled between the first potential and the second signal line and the fourth current source coupled between the second signal line and the second potential.

19. The baseline wander reduction apparatus described in claim 15 wherein baseline wander detector circuit comprises:
   a first comparator to determine whether a difference between the first and second peak amplitudes signals is greater than a preset threshold voltage, the first comparator to generate the positive baseline wander enable signal;
   a second comparator to determine whether a difference between the second and first peak amplitudes signals is greater than a preset threshold voltage, the second comparator to generate the negative baseline wander enable signal.

20. The baseline wander reduction apparatus described in claim 14 wherein the positive baseline wander enable signal is filtered by a first low-pass filter and the negative baseline wander enable signal is filtered by a second low-pass filter.

* * * * *

UNITED STATES PATENT AND TRADEMARK OFFICE
CERTIFICATE OF CORRECTION

PATENT NO.   : 6,140,857
DATED        : October 31, 2000
INVENTOR(S)  : Rosen

It is certified that error appears in the above-identified patent and that said Letters Patent is hereby corrected as shown below:

Column 8,
Line 65, before "signal", delete "signal".
Line 66, before "line", insert -- signal --.

Signed and Sealed this

Eighteenth Day of June, 2002

Attest:

JAMES E. ROGAN
Attesting Officer         Director of the United States Patent and Trademark Office